United States Patent
Chen et al.

(10) Patent No.: US 9,142,266 B2
(45) Date of Patent: Sep. 22, 2015

(54) MEMORY CIRCUITRY USING WRITE ASSIST VOLTAGE BOOST

(71) Applicant: ARM LIMITED, Cambridge (GB)

(72) Inventors: Andy Wangkun Chen, Austin, TX (US); Yew Keong Chong, Austin, TX (US); Gus Yeung, Austin, TX (US); Bo Zheng, San Jose, CA (US); George Lattimore, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/083,619

(22) Filed: Nov. 19, 2013

(65) Prior Publication Data
US 2015/0138901 A1    May 21, 2015

(51) Int. Cl.
| | |
|---|---|
| G11C 7/00 | (2006.01) |
| G11C 7/10 | (2006.01) |
| G11C 7/12 | (2006.01) |
| G11C 8/12 | (2006.01) |
| G11C 7/22 | (2006.01) |
| G11C 5/14 | (2006.01) |

(52) U.S. Cl.
CPC .............. *G11C 7/1078* (2013.01); *G11C 5/147* (2013.01); *G11C 7/12* (2013.01); *G11C 7/22* (2013.01); *G11C 8/12* (2013.01)

(58) Field of Classification Search
CPC .................. G11C 13/0069; G11C 7/22; G11C 2013/0092; G11C 7/1078; G11C 11/4074; G11C 5/147; G11C 7/1048
USPC .................. 365/189.16, 189.011, 226, 230.06
See application file for complete search history.

(56) References Cited

U.S. PATENT DOCUMENTS

| | | | |
|---|---|---|---|
| 6,671,201 B2 | 12/2003 | Masuda | |
| 8,218,390 B2* | 7/2012 | Nii et al. | ........................ 365/226 |
| 8,233,342 B2 | 7/2012 | Adams et al. | |
| 8,363,453 B2 | 1/2013 | Arsovski et al. | |
| 2007/0081379 A1 | 4/2007 | Clinton et al. | |
| 2011/0032779 A1 | 2/2011 | Aihara et al. | |
| 2012/0020146 A1 | 1/2012 | Jung et al. | |
| 2012/0140551 A1 | 6/2012 | Arsovski et al. | |

FOREIGN PATENT DOCUMENTS

WO    2013-137888 A1    9/2013

OTHER PUBLICATIONS

J. Chang et al, "A 20nm 112MB SRAM in High-k Metal-Gate with Assist Circuitry for Low-Leakage and Low-VMIN Applications" IEEE International Solid-State Circuits Conference, 2013, pp. 316-318.

(Continued)

*Primary Examiner* — David Lam
(74) *Attorney, Agent, or Firm* — Pramudji Law Group PLLC; Ari Pramudji

(57) ABSTRACT

Within a memory 2 comprising an array 4 of bit cells 6 write driver circuitry 14 uses a boosted write signal which is boosted to a lower than normal level during a write operation. Column select transistors 16 are driven by column select circuitry 12. The column select signal is boosted to a lower than normal level when a column is unselected and to higher than a normal level when a column is selected. Voltage boost circuitry, such as charge pumps 20, 22 are employed within the column select circuitry 12 to achieve these boosted levels for the columns select signal.

12 Claims, 3 Drawing Sheets

(56) References Cited

OTHER PUBLICATIONS

S. Mukhopadhyay et al, "SRAM Write-Ability Improvement With Transient Negative Bit-Line Voltage" IEEE Transactions on Very Large Scale Integration (VLSI) Systems, vol. 19, No. 1, Jan. 2011, pp. 24-32.

UKIPO Search Report; GB 1419161.3; Mar. 17, 2015.

* cited by examiner

MEMORY CIRCUITRY USING WRITE ASSIST VOLTAGE BOOST

BACKGROUND OF THE INVENTION

1. Field of the Invention

This invention relates to the field of memory circuitry. More particularly, this invention relates to memory circuitry using write assist boost to facilitate write operations.

2. Description of the Prior Art

It is known to provide memory circuitry including write driver circuitry for generating a write signal used to perform a write operation to a selected column of bit cells within an array of bit cells. The column to be written is selected using a column select transistor controlled by a column select signal. The array of bits cells may be supplied with power via power supply rails at a ground level (Vss) and a higher Vddc level. In order to facilitate write operations, the write signal may be driven to a voltage level below the ground level during the write operation so as to discharge the appropriate bit line running through the array more rapidly and to a lower voltage level.

SUMMARY OF THE INVENTION

Viewed from one aspect the present invention provides a memory circuitry comprising:
an array of bit cells;
a plurality of bit lines, each of said plurality of bit lines coupled to a column of bit cells within said array;
write driver circuitry selectively coupled to each of said bit lines through a respective column select transistor controlled by a column select signal, said write driver circuitry supplying write signal with a write voltage level outside of a voltage range between a first voltage level and a second voltage level in order to perform a write operation within said array;
column select circuitry coupled to a power supply via a first power supply rail at said first voltage level and a second power supply rail at said second voltage level, said first voltage level being higher than said second voltage level, said column select circuitry being configured to select one or more target columns of bit cells within to which a write operation is to be performed by:
(i) supplying a column select signal with a selected signal level to respective column select transistors for said one or more target columns, said selected signal level holding said respective column select transistor for said one or more target columns in a low impedance state; and
(ii) supplying a column select signal with an unselected signal level to respective column select transistors for one or more unselected columns within said array other than said one or more target columns, said unselected signal level holding said respective column select transistor for said one or more other columns in a high impedance state;
wherein at least one of said selected signal level and said unselected signal level is outside of said voltage range between said first voltage level and said second voltage level.

The present invention recognises that while the use of write signals with boosted voltages (e.g. voltages driven below the ground voltage level) may assist write operations in some ways, it brings with it some potential disadvantages. In particular, the column select transistors for unselected columns to which write operations are not desired may undesirably be switched on (or at least rendered more conductive/leaky) due to the write boosted low potential on the bit lines causing a gate-to-source voltage on the column select transistor which exceeds or at least becomes a significant part of the transistor threshold voltage level. Similarly, in the case of selected columns the write signal which is boosted to a level below the ground voltage may cause undesired leakage through the passgate transistors of rows of bit cells which are not selected in a manner that can create an error in operation, or at least an increase in power consumption. The present techniques address these problems by boosting the column select signals to voltages outside the normal operating voltage range of the column select circuitry. These boosted voltages can have valves not constrained by other supply voltages also present within the memory circuitry. In the case of unselected columns, the column select signal may be boosted down below the ground level to a similar extent to that by which the write signal is boosted below the ground level thereby reducing the gate-to-source voltage which might otherwise inappropriately switch on (or cause to leak) the column select transistor. In the case of selected columns, the column select voltage can be boosted above the voltage level normally used by the column select circuitry itself so as to improve write operations without the need to boost the write signal to a further degree below the ground level in a manner that would then increase the chance of a write disturbance within unselected rows within a selected column.

It will be appreciated that the write voltage level is boosted to outside the voltage range used as the supply to the column select circuitry. In some embodiments the write voltage level is lower than the second voltage level, i.e. lower than the lower supply voltage level to the column selecting circuitry.

In the context of a write voltage level that is boosted lower, the column select transistors which are subject to potential problems are NMOS transistors as conventionally used within memory circuits for this purpose and accordingly the unselected voltage level is also boosted to be lower than the second voltage level.

In a similar manner for such NMOS column select transistors the selected voltage level may be boosted to be higher than the first voltage level, which is the high supply voltage level used by the column select circuitry.

It will be appreciated that the boosting of the selected voltage level and the boosting of the unselected voltage level could be employed separately if desired. However, in some embodiments both techniques may be used in combination.

The generation of the selected voltage level and the unselected voltage level outside of the range between the first voltage level and the second voltage level is facilitated by the use of voltage boosting circuitry, such as charge pumps, within the column select circuitry.

Example embodiments of memory circuitry using the present techniques may include precharge circuitry which says to precharge the bit lines to a high voltage level with the write driver circuitry being configured to discharge bit lines for one or more target columns towards the write voltage level in order to perform a write operation.

In some embodiments word line circuitry within the memory may be used to select a target row of bit cells within the array to which a write operation is to be performed. Such word line circuitry may generate a word line signal which controls passgate transistors for each bit cell serving to selectively couple that bit cell to one or more corresponding bit lines. The passgate transistors which may leak if the write boost is too large in magnitude may be NMOS transistors.

The bit cells themselves can take a variety of different forms. In some embodiments a high degree of efficiency may be achieved by the use of 6T bit cells (6 transistor bit cells).

Viewed from another aspect the present invention provides a memory circuitry comprising:

an array of bit cell means for storing data values;

a plurality of bit lines, each of said plurality of bit lines coupled to a column of bit cell means within said array;

write driver means for supplying a write signal, said write driver means being selectively coupled to each of said bit lines through a respective column select transistor controlled by a column select signal, said write signal having a write voltage level outside of a voltage range between a first voltage level and a second voltage level in order to perform a write operation within said array;

column select means for selecting one or more target columns of bit cell means within to which a write operation is to be performed, said column select means being coupled to a power supply via a first power supply rail at said first voltage level and a second power supply rail at said second voltage level, said first voltage level being higher than said second voltage level, and said write operation is performed by:

(i) supplying a column select signal with a selected signal level to respective column select transistors for said one or more target columns, said selected signal level holding said respective column select transistor for said one or more target columns in a low impedance state; and (ii) supplying a column select signal with an unselected signal level to respective column select transistors for one or more unselected columns within said array other than said one or more target columns, said unselected signal level holding said respective column select transistor for said one or more other columns in a high impedance state;

wherein at least one of said selected signal level and said unselected signal level is outside of said voltage range between said first voltage level and said second voltage level.

Viewed from a further aspect the present invention provides a method of operating memory circuitry comprising:

an array of bit cells for storing data values;

a plurality of bit lines, each of said plurality of bit lines coupled to a column of bit cells within said array; and column select circuitry coupled to a power supply via a first power supply rail at a first voltage level and a second power supply rail at a second voltage level, said first voltage level being higher than said second voltage level, said method comprising the steps of:

selectively supplying a write signal with a write voltage level to each of said bit lines through a respective column select transistor controlled by a column select signal, said write signal having a write voltage level outside of a voltage range between said first voltage level and said second voltage level in order to perform a write operation within said array;

selecting with said column select circuitry one or more target columns of bit cells within to which a write operation is to be performed by:

(i) supplying a column select signal with a selected signal level to respective column select transistors for said one or more target columns, said selected signal level holding said respective column select transistor for said one or more target columns in a low impedance state; and (ii) supplying a column select signal with an unselected signal level to respective column select transistors for one or more unselected columns within said array other than said one or more target columns, said unselected signal level holding said respective column select transistor for said one or more other columns in a high impedance state;

wherein at least one of said selected signal level and said unselected signal level is outside of said voltage range between said first voltage level and said second voltage level.

The above, and other objects, features and advantages of this invention will be apparent from the following detailed description of illustrative embodiments which is to be read in connection with the accompanying drawings.

BRIEF DESCRIPTION OF THE DRAWINGS

Embodiments of the invention will now be described, by way of example only, with reference to the accompanying drawings in which.

DESCRIPTION OF THE EMBODIMENTS

Figure 1:
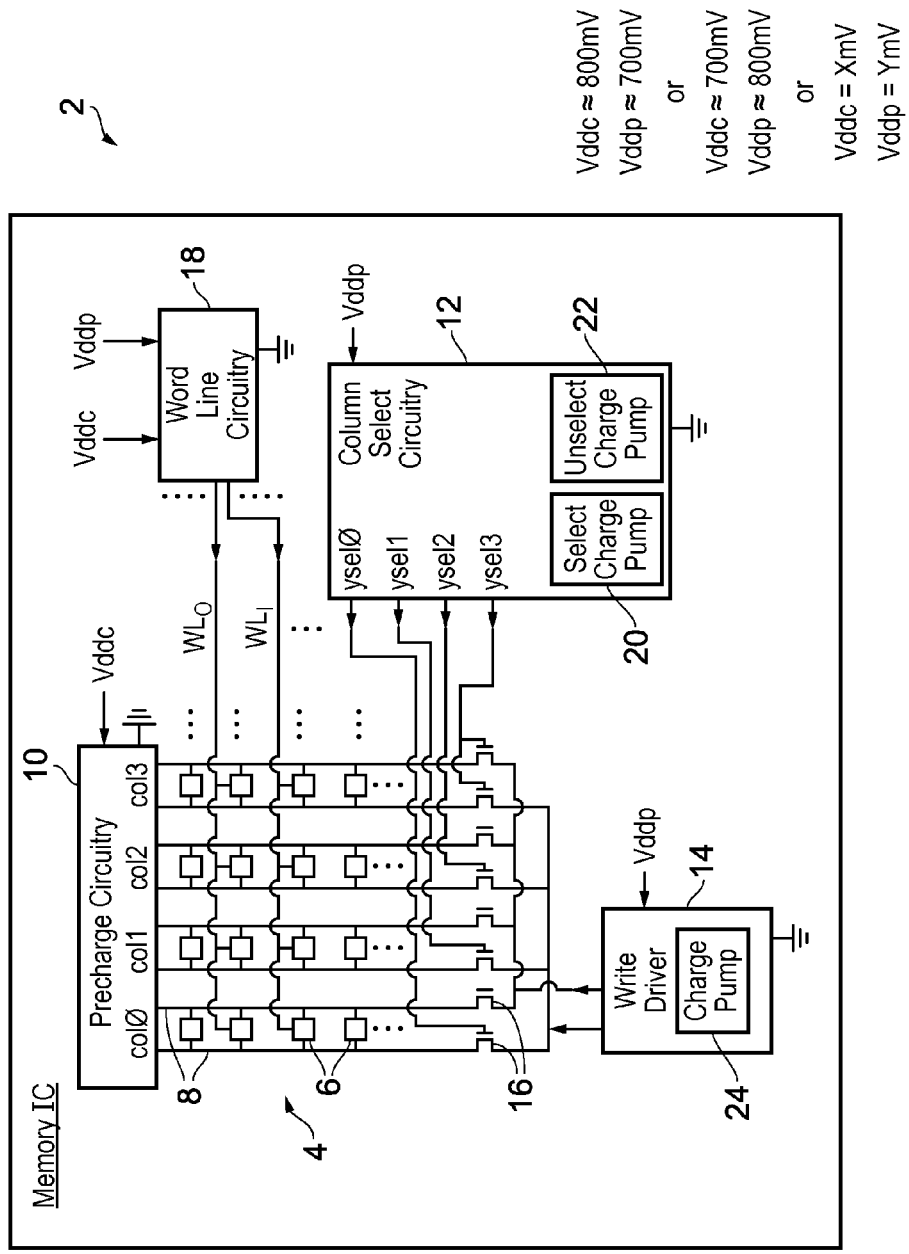
FIG. 1 schematically illustrates memory circuitry utilising a boosted write signal.

FIG. 1 schematically illustrates an integrated circuit 2 incorporating memory circuitry. The memory circuitry 2 includes an array 4 of bit cells 6 arranged in columns and rows. Precharge circuitry 10 serves to precharge bit lines 8 connected to respective columns of bit cell 6 to a precharged high voltage level. When a write operation is desired, then column select circuitry 12 serves to generate column select signals ysel0 to ysel3 that selectively couple one of the columns of bit cells 6 to a write voltage generated by write driver circuitry 14. The column select signals ysel0 to ysel3 are supplied as gate voltages to column select transistors 16 disposed between the write driver circuitry 14 and the bit lines 8 which are associated with each column of bit cells 6. An individual bit cell 6 may be written by selecting the column containing that bit cell with a column select signal ysel0 to ysel3 while also using word line circuitry 18 and a word line signal WL to select the row of bit cell 6 containing the desired bit cell to be written.

The column select signals ysel0 to ysel3 select a target of column bit cells by asserting a column select signal with the selected voltage level for that target column of bit cells. The remaining columns of bit cells are unselected and the column select signals such unselected columns are set out and unselected voltage level. The selected voltage level holds the column select transistor 16 in a low impedance state (switched on). The unselected voltage level holds the column select transistor 16 in a high impedance state (switched off).

The column select circuitry 12 includes a select charge pump 20 which serves to generate the column select signal at the selected voltage level which is higher than the supply voltage level Vddp used by the column select circuitry 12 itself. Unselect charge pump circuitry 22 serves to generate the column select signal at the unselected voltage level which is lower than the ground voltage level used by the column select circuitry 12 for supply to the unselected columns within the array 4.

The write driver circuitry 14 also includes a charge pump 24 for generating the write signal at a voltage level which is below the voltage level of the supply for the write driver circuitry 14, namely below the ground level of the supply used by the write driver circuitry 14.

It will be appreciated that in the example embodiment of FIG. 1, the write driver circuitry 14, the column select circuitry 12 and the word line circuitry 18 are all supplied by a power supply having rails associated with a first voltage level (Vddp) and a second voltage level (Ground or Vss). The word line circuitry 18, in some embodiments, also receives supply voltage Vddc to power some of its elements. The power supply to the array 4 uses a different voltage mainly Vddc and Ground. It will be appreciated that Ground in some embodiments may be a Vss voltage level. The level of Vddc in this example embodiment is a higher voltage than that of Vddp, although this is not necessarily the case and in some embodiments Vddc may be less than Vddp. More generally Vddc and Vddp may take values selected to match the requirements of the circuits they supply.

Figure 2:
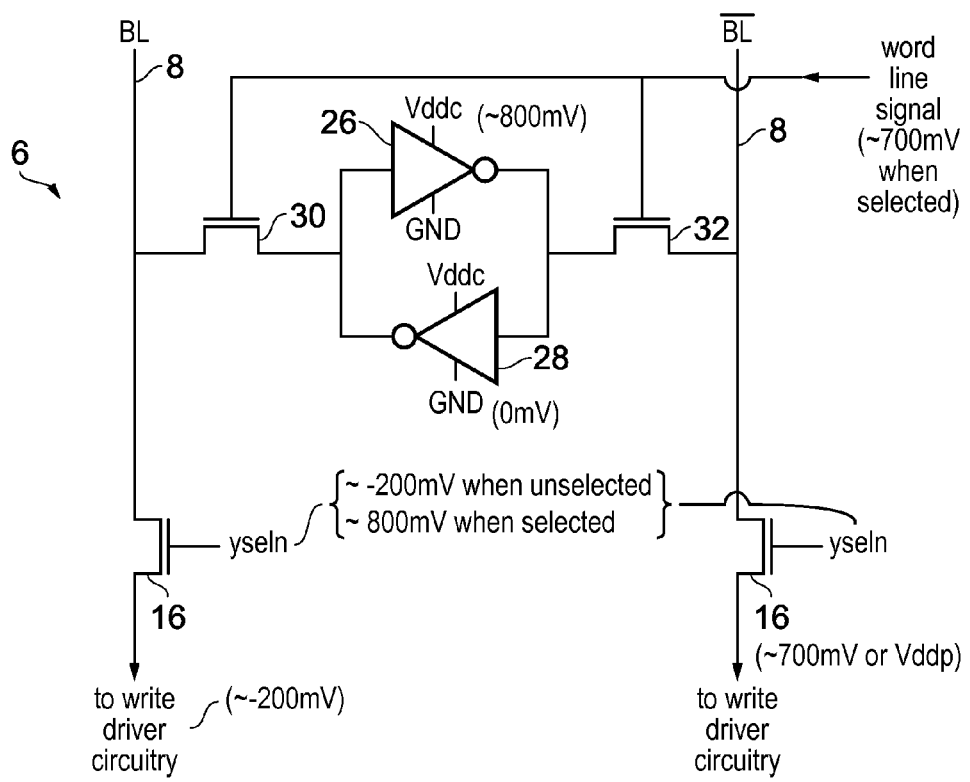
FIG. 2 schematically illustrates a bit cell and the different voltages used to control that bit cell during a write operation.

FIG. 2 schematically illustrates a bit cell 6 comprising a 6T bit cell formed of two inverters 26, 28 and two NMOS transistors serving as passgate transistors 30, 32. The bit lines 8 are connected via column select transistors 16 to the write driver circuitry 14. The write driver circuitry 14 when performing a write operation drives either of the bit lines low depending upon what bit value is to be written into the bit cell 6. In order to allow the appropriate one of the bit liens 8 to be driven low, the column select transistors 16 are both switched to a low impedance state from a high impedance state by a column select signal yseln being placed at the selected signal level. The selected signal level in the case of the NMOS transistors serving as the column select transistors is a high signal level.

The write signal applied to the appropriate one of the bit lines 8 has a write voltage level which is boosted by the charge pump 24 to be below the normal ground level (e.g. 0 mV), i.e. to a level of −200 mV in the example embodiment of FIG. 2. In this example bit line BL is discharged to −200 mV and bit line $\overline{BL}$ is maintained at 700 mV or Vddp. If a different bit value were being written hen bit line $\overline{BL}$ would be discharged and the voltage of bit line BL would be maintained.

In this example embodiment the level of Vddp (control circuitry supply voltage) may be 700 mV while the level of Vddc (core supply voltage) may be 800 mV. The 6T bit cells 6 is supplied with the Vddc power supply level. The write driver circuitry 14, the column select circuitry 12 and the word line circuitry 18 is all part of the control circuitry and is supplied with power at the Vddp level.

The select charge pump 20 and the unselect charge pump 22 within the column select circuitry 12 generate an unselect signal level for the column select signal with a level of approximately −200 mV so as to match the boosted write signal level. The select charge pump 20 produces, in this example embodiment, a select signal level for the column select signal of approximately 800 mV for controlling the column select transistor 16 when the column is selected. While the column select signal level of 800 mV is substantially the same as Vddc in this example, in fact the boosted column select signal level need not have any particular relationship with the level of Vddc, e.g. may be lower, higher or the same. It will be appreciated that both the unselect voltage level and select voltage level are outside of the range of the supply voltage of the column select circuitry itself, i.e. namely Vddp to ground (700 mV to 0 mV).

Figure 3:
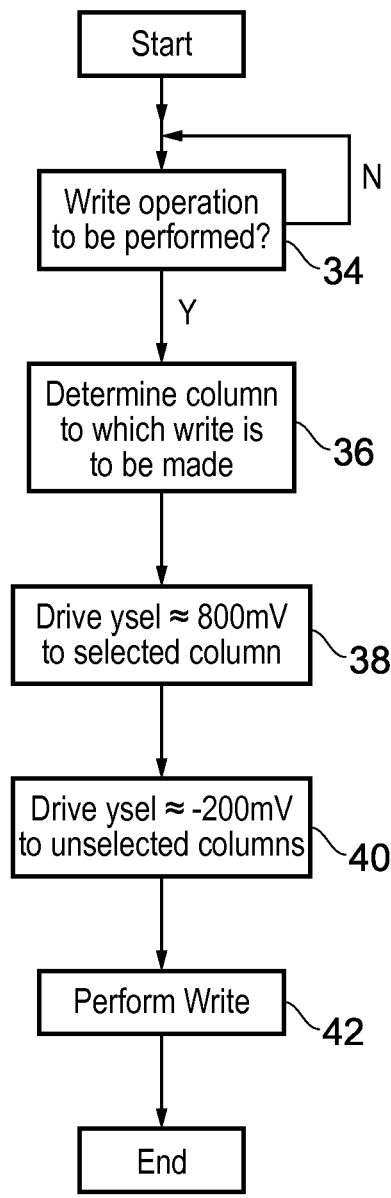
FIG. 3 is a flow diagram schematically illustrating a write operation.

FIG. 3 is a flow diagram schematically illustrating the operation of the circuitry of FIG. 2 when a write operation is performed. At step 34 processing waits until a write operation is performed. At step 36 the column select circuitry 12 determines which column or columns within the array 4 are to be written. Step 38 drives the column select signal at a level of approximately 800 mV for the selected columns Step 40 drives the column select signal to a level of −200 mV for the unselected columns Step 42 then performs the write operation using the boosted write signal of approximately −200 mV.

It will be appreciated that the use of the boosted column select signals both drives this to a lower than normal level when a column is unselected and to higher than a normal level when a column is selected. This improves write performance.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Memory circuitry comprising:
an array of bit cells;
a plurality of bit lines, each of said plurality of bit lines coupled to a column of bit cells within said array;
write driver circuitry selectively coupled to each of said bit lines through a respective column select transistor controlled by a column select signal, said write driver circuitry supplying write signal with a write voltage level outside of a voltage range between a first voltage level and a second voltage level in order to perform a write operation within said array;
column select circuitry coupled to a power supply via a first power supply rail at said first voltage level and a second power supply rail at said second voltage level, said first voltage level being higher than said second voltage level, said column select circuitry being configured to select one or more target columns of bit cells within to which a write operation is to be performed by:
 (i) supplying a column select signal with a selected signal level to respective column select transistors for said one or more target columns, said selected signal level holding said respective column select transistor for said one or more target columns in a low impedance state; and
 (ii) supplying a column select signal with an unselected signal level to respective column select transistors for one or more unselected columns within said array other than said one or more target columns, said unselected signal level holding said respective column select transistor for said one or more other columns in a high impedance state;
wherein at least one of said selected signal level and said unselected signal level is outside of said voltage range between said first voltage level and said second voltage level.

2. Memory circuitry as claimed in claim 1, wherein said write voltage level is lower than said second voltage level.

3. Memory circuitry as claimed in claim 2, wherein said column select transistors are NMOS transistors and said unselected voltage level is lower than said second voltage level.

4. Memory circuitry as claimed in claim 2, wherein said column select transistors are NMOS transistors and said selected voltage level is higher than said first voltage level.

5. Memory circuitry as claimed in claim 2, wherein said column select transistors are NMOS transistors, said unselected voltage level is lower than said second voltage level and said selected voltage level is higher than said first voltage level.

6. Memory circuitry as claimed in claim 1, wherein said column select circuitry includes voltage boosting circuitry configured to generate voltage levels outside of said voltage range between said first voltage level and said second voltage level.

7. Memory circuitry as claimed in claim 1, comprising precharge circuitry configured to precharge said plurality of bit lines to a high voltage level, wherein said write driver circuitry is configured to discharge said bit lines for said one or more target column towards said write voltage level in order to perform said write operation.

8. Memory circuitry as claimed in claim 1, comprising word line circuitry configured to select a target row of bit cells within said array to which said write operation is to be performed, said word line circuitry configured to generate respective word lines signals for controlling passgate transistors within each bit cell that selectively couple said bit cell to one or more corresponding bit lines.

9. Memory circuitry as claimed in claim 8, wherein said write voltage level is lower than said second voltage level and said passgate transistor is an NMOS transistor.

10. Memory circuitry as claimed in claim 1, wherein said bits cells are 6T bit cells.

11. Memory circuitry comprising:
an array of bit cell means for storing data values;
a plurality of bit lines, each of said plurality of bit lines coupled to a column of bit cell means within said array;
write driver means for supplying a write signal, said write driver means being selectively coupled to each of said bit lines through a respective column select transistor controlled by a column select signal, said write signal having a write voltage level outside of a voltage range between a first voltage level and a second voltage level in order to perform a write operation within said array;
column select means for selecting one or more target columns of bit cell means within to which a write operation is to be performed, said column select means being coupled to a power supply via a first power supply rail at said first voltage level and a second power supply rail at said second voltage level, said first voltage level being higher than said second voltage level, and said write operation is performed by:
    (i) supplying a column select signal with a selected signal level to respective column select transistors for said one or more target columns, said selected signal level holding said respective column select transistor for said one or more target columns in a low impedance state; and
    (ii) supplying a column select signal with an unselected signal level to respective column select transistors for one or more unselected columns within said array other than said one or more target columns, said unselected signal level holding said respective column select transistor for said one or more other columns in a high impedance state;
wherein at least one of said selected signal level and said unselected signal level is outside of said voltage range between said first voltage level and said second voltage level.

12. A method of operating memory circuitry comprising:
an array of bit cells for storing data values;
a plurality of bit lines, each of said plurality of bit lines coupled to a column of bit cells within said array; and
column select circuitry coupled to a power supply via a first power supply rail at a first voltage level and a second power supply rail at a second voltage level, said first voltage level being higher than said second voltage level,
said method comprising the steps of:
selectively supplying a write signal with a write voltage level to each of said bit lines through a respective column select transistor controlled by a column select signal, said write signal having a write voltage level outside of a voltage range between said first voltage level and said second voltage level in order to perform a write operation within said array;
selecting with said column select circuitry one or more target columns of bit cells within to which a write operation is to be performed by:
    (i) supplying a column select signal with a selected signal level to respective column select transistors for said one or more target columns, said selected signal level holding said respective column select transistor for said one or more target columns in a low impedance state; and
    (ii) supplying a column select signal with an unselected signal level to respective column select transistors for one or more unselected columns within said array other than said one or more target columns, said unselected signal level holding said respective column select transistor for said one or more other columns in a high impedance state;
wherein at least one of said selected signal level and said unselected signal level is outside of said voltage range between said first voltage level and said second voltage level.

* * * * *